(12) United States Patent
Higashi et al.

(10) Patent No.: US 8,916,417 B2
(45) Date of Patent: Dec. 23, 2014

(54) METHOD OF MANUFACTURING SEMICONDUCTOR DEVICE HAVING CHIP STACKS COMBINED IN RELATION TO THE NUMBER OF CHIPS HAVING DEFECTS

(75) Inventors: Kazuyuki Higashi, Yokohama (JP); Yoshiaki Sugizaki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,088

(22) Filed: Aug. 31, 2012

(65) Prior Publication Data
US 2013/0234339 A1 Sep. 12, 2013

(30) Foreign Application Priority Data
Sep. 30, 2011 (JP) ................. 2011-217929

(51) Int. Cl.
*H01L 21/44* (2006.01)
*H01L 21/48* (2006.01)
(Continued)

(52) U.S. Cl.
CPC ............ *H01L 21/82* (2013.01); *H01L 23/5384* (2013.01); *H01L 21/6835* (2013.01); *H01L 24/94* (2013.01); *H01L 25/0657* (2013.01); *H01L 25/50* (2013.01); *H01L 22/20* (2013.01); *H01L 21/6836* (2013.01); *H01L 23/481* (2013.01); *H01L 2224/48091* (2013.01); *H01L 2924/10253* (2013.01); *H01L 2924/37001* (2013.01); *H01L 2224/83005* (2013.01); *H01L 24/16* (2013.01); *H01L 24/32* (2013.01); *H01L 24/48* (2013.01); *H01L 24/83* (2013.01); *H01L 24/92* (2013.01);

(Continued)

(58) Field of Classification Search
USPC ......... 438/629, 637, 639, 640, 667, 668, 672, 438/675, 700, 701, 713, 107, 108, 109, 110
See application file for complete search history.

(56) References Cited

U.S. PATENT DOCUMENTS 7,952,184 B2 * 5/2011 Farrar et al. ................... 257/687
7,952,201 B2 5/2011 Shibata et al.
(Continued)

FOREIGN PATENT DOCUMENTS

JP 2008-306105 12/2008
JP 2009-253114 10/2009
(Continued)

OTHER PUBLICATIONS

Office Action issued Sep. 30, 2014 in Japanese Patent Application No. 2011-217929 (with English Translation).

*Primary Examiner* — A. Sefer
*Assistant Examiner* — Dilinh Nguyen
(74) *Attorney, Agent, or Firm* — Oblon, Spivak, McClelland, Maier & Neustadt, L.L.P.

(57) ABSTRACT

After stacking m wafers in each of which a plurality of semiconductor chips are formed, the m wafers are diced to semiconductor chips to form a first chip stack having m of the semiconductor chips stacked, and, after stacking n wafers, the n wafers are diced to semiconductor chips to form a second chip stack having n of the semiconductor chips stacked. Next, the first chip stack is sorted according to the number of defective semiconductor chips included in the first chip stack, and the second chip stack is sorted according to the number of defective semiconductor chips included in the second chip stack. Furthermore, the first chip stack or the second chip stack after sorting are combined to form a third chip stack.

8 Claims, 5 Drawing Sheets

(51) Int. Cl.
  *H01L 21/50* (2006.01)
  *H01L 21/4763* (2006.01)
  *H01L 21/82* (2006.01)
  *H01L 23/538* (2006.01)
  *H01L 21/683* (2006.01)
  *H01L 23/00* (2006.01)
  *H01L 25/065* (2006.01)
  *H01L 25/00* (2006.01)
  *H01L 21/66* (2006.01)
  *H01L 23/48* (2006.01)

(52) U.S. Cl.
  CPC ............... *H01L 2224/16145* (2013.01); *H01L 2224/16225* (2013.01); *H01L 2224/32145* (2013.01); *H01L 2224/48227* (2013.01); *H01L 2224/9202* (2013.01); *H01L 2225/0651* (2013.01); *H01L 2225/06517* (2013.01); *H01L 2924/1434* (2013.01); *H01L 2924/15311* (2013.01); *H01L 2225/06513* (2013.01); *H01L 2225/06541* (2013.01); *H01L 2225/06565* (2013.01); *H01L 22/14* (2013.01); *H01L 2221/68327* (2013.01); *H01L 2221/6834* (2013.01)
  USPC ........... 438/107; 438/629; 438/637; 438/667; 438/672; 438/675; 438/108; 438/109

(56) References Cited

U.S. PATENT DOCUMENTS

2008/0096320 A1* 4/2008 Farrar ..................... 438/113
2008/0305565 A1 12/2008 Shizuno

FOREIGN PATENT DOCUMENTS

| JP | 2009-272388 | 11/2009 |
| JP | 2010-45166 | 2/2010 |
| JP | 2010-507254 | 3/2010 |
| JP | 2011-166109 | 8/2011 |

* cited by examiner

FIG. 3A

[All-Chip Non-Defect Rate]

|  |  | One Wafer Yield | | | |
|---|---|---|---|---|---|
|  |  | 95% | 90% | 85% | 80% |
| Number of Stacked Wafers | 1 | 95% | 90% | 85% | 85% |
|  | 2 | 90% | 81% | 72% | 64% |
|  | 3 | 86% | 73% | 61% | 51% |
|  | 4 | 81% | 66% | 52% | 41% |
|  | 5 | 77% | 59% | 44% | 33% |
|  | 6 | 74% | 53% | 38% | 26% |

FIG. 3B

[One-Chip Defect Rate]

|  |  | One Wafer Yield | | | |
|---|---|---|---|---|---|
|  |  | 95% | 90% | 85% | 80% |
| Number of Stacked Wafers | 1 | 5% | 10% | 15% | 20% |
|  | 2 | 10% | 18% | 26% | 32% |
|  | 3 | 14% | 24% | 33% | 38% |
|  | 4 | 17% | 29% | 37% | 41% |
|  | 5 | 20% | 33% | 39% | 41% |
|  | 6 | 23% | 35% | 40% | 39% |

FIG. 3C

[Two-Chip Defect Rate]

|  |  | One Wafer Yield | | | |
|---|---|---|---|---|---|
|  |  | 95% | 90% | 85% | 80% |
| Number of Stacked Wafers | 1 |  |  |  |  |
|  | 2 | 0% | 1% | 2% | 4% |
|  | 3 | 1% | 3% | 6% | 10% |
|  | 4 | 1% | 5% | 10% | 15% |
|  | 5 | 2% | 7% | 14% | 20% |
|  | 6 | 3% | 10% | 18% | 25% |

METHOD OF MANUFACTURING SEMICONDUCTOR DEVICE HAVING CHIP STACKS COMBINED IN RELATION TO THE NUMBER OF CHIPS HAVING DEFECTS

CROSS REFERENCE TO RELATED APPLICATIONS

This application is based on and claims the benefit of priority from prior Japanese Patent Application No. 2011-217929, filed on Sep. 30, 2011, the entire contents of which are incorporated herein by reference.

FIELD

Embodiments described in the present specification relate to a semiconductor device and a method of manufacturing the same, and to a management system of a semiconductor device.

BACKGROUND

Manufacturing technology in which a stacked plurality of semiconductor chips are connected by a silicon penetrating electrode is attracting attention as a means of achieving an even higher degree of integration of a semiconductor integrated circuit. Known methods in the case of stacking a plurality of semiconductor chips include a method that first performs dicing of wafers and then stacks the chips (Chip to Chip stacking method, hereafter called "C2C method"), and a method that stacks the wafers before dicing the wafers and thereby performs dicing after stacking (Wafer to Wafer method, hereafter called "W2W method").

The W2W method is superior to the C2C method in terms of manufacturing efficiency, but has a disadvantage that, when defect rate in each of the wafers increases, the defect rate rises cumulatively with increasing number of stacked wafers, thereby leading to a fall in product yield and rise in final product cost.

BRIEF DESCRIPTION OF THE DRAWINGS

FIG. 3 includes tables showing the relationship between proportion of defective semiconductor chips among the semiconductor chips included in one wafer, number of stacked wafers (number stacked), and yield in a first chip stack 20 or a second chip stack 30.

DETAILED DESCRIPTION

In a method of manufacturing a semiconductor device in an embodiment described below, first, after stacking m wafers in each of which are formed a plurality of semiconductor chips, dicing of the m wafers is performed on the basis of the semiconductor chips to form a first chip stack having m of the semiconductor chips stacked, and, after stacking n of the wafers, dicing of the n wafers is performed on the basis of the semiconductor chips to form a second chip stack having n of the semiconductor chips stacked. Next, the first chip stack is sorted according to the number of defective semiconductor chips included in the first chip stack, and the second chip stack is sorted according to the number of defective semiconductor chips included in the second chip stack. Furthermore, the first chip stack or the second chip stack after sorting are combined to form a third chip stack.

Next, a semiconductor device and a method of manufacturing the same according to an embodiment of the present invention are described in detail with reference to the drawings.

Figure 1:
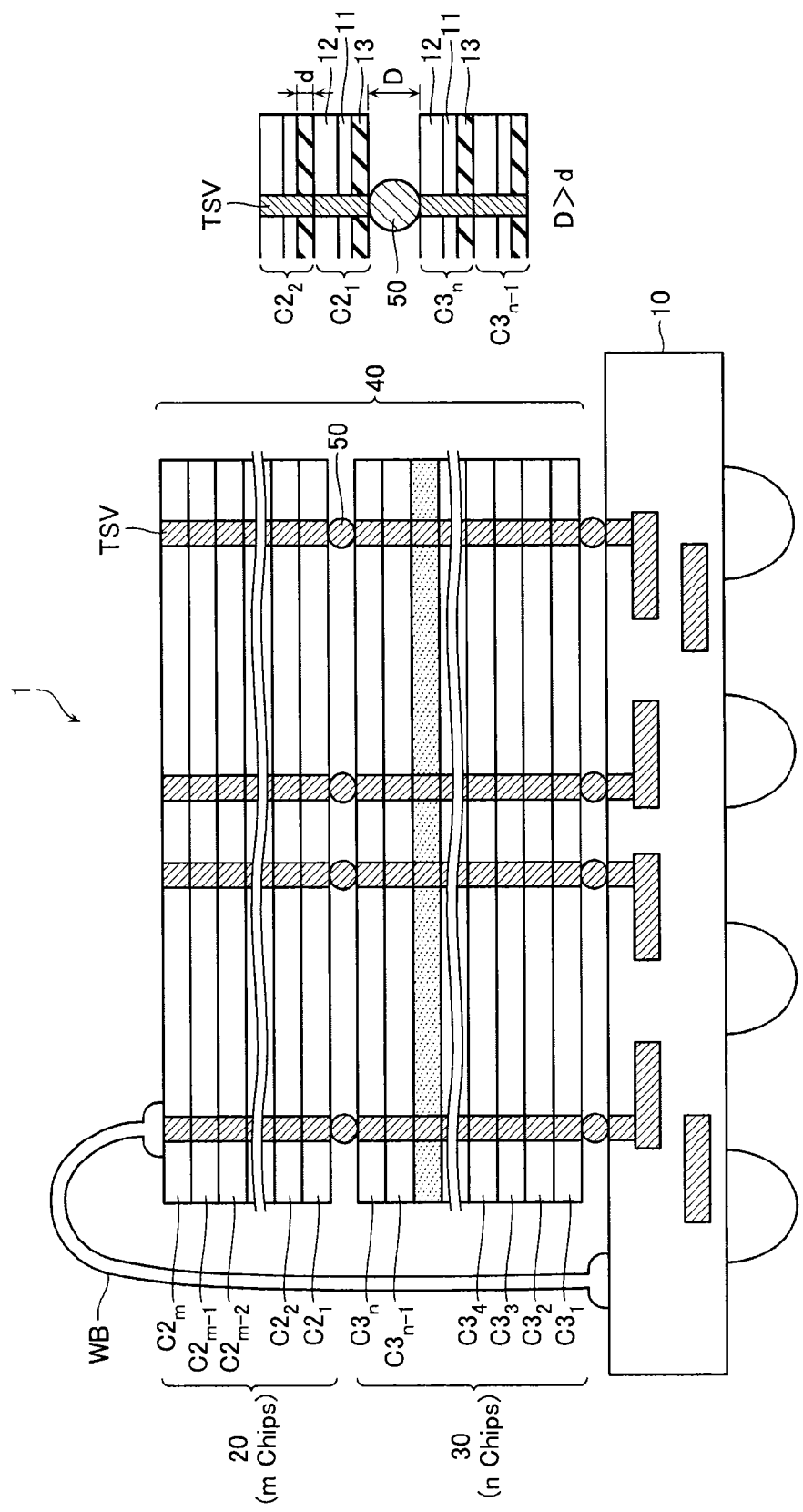
FIG. 1 is a schematic view showing an overall configuration of a semiconductor device according to the present embodiment.

A configuration of a semiconductor device 1 according to the present embodiment is described with reference to FIG. 1. As shown in FIG. 1, the semiconductor device of the present embodiment comprises a third chip stack 40 on a package substrate 10, the third chip stack 40 being configured by stacking a first chip stack 20 and a second chip stack 30. The first chip stack 20 and the second chip stack 30 are electrically connected by a ball grid array (BGA) 50 or the like.

The first chip stack 20 is formed by stacking m memory chips $C2_1$-$C2_m$. The memory chips $C2_1$-$C2_m$ each include a silicon wafer 11 and an element forming layer 12 formed on this silicon wafer 11, and are joined to one another by an adhesive agent 13. The memory chips $C2_1$-$C2_m$ each include a penetrating electrode TSV and are electrically connected to separate memory chips C2 provided above and below, by this penetrating electrode TSV.

Similarly, the second chip stack 30 is formed by stacking n memory chips $C3_1$-$C3_n$. The memory chips $C3_1$-$C3_n$ each include a penetrating electrode TSV and are electrically connected to separate memory chips C3 provided above and below, by this penetrating electrode TSV.

Note that a distance d between the memory chips C2 in the first chip stack 20 is smaller than a distance D between the memory chip $C2_1$ in a lowermost layer of the first chip stack 20 and the memory chip $C3_n$ in an uppermost layer of the second chip stack 30 connected by the BGA 50.

The numbers m and n are determined by the number p of non-defective memory chips C to be included finally in the third chip stack 40. Preferably, n is a number larger than m, for example, a number larger than m by an amount of 1 (n=m+1).

The third chip stack 40 may include at least one, specifically (m+n−p), defective semiconductor chips. When there is one defective semiconductor chip included in the third chip stack 40, either one of the first chip stack 20 and the second chip stack 30 includes one defective semiconductor chip, and the other of the first chip stack 20 and the second chip stack 30 does not include a defective semiconductor chip but has all of the semiconductor chips non-defective. In this specification, the expression "defective semiconductor chip" is used with the meaning that the chip is defective in its entirety (the chip itself is defective), and that the chip is not provided for use in its entirety.

The first chip stack 20 and the second chip stack of the present embodiment are formed using the above-mentioned W2W method. That is, after stacking a plurality of wafers in each of which a plurality of semiconductor chips are formed, wafers are diced to semiconductor chips to form a chip stack having a plurality of the semiconductor chips stacked. A method of manufacturing the first chip stack 20 and the second chip stack 30 by the W2W method herein is described with reference to FIGS. 2A-2I.

Figure 2A:
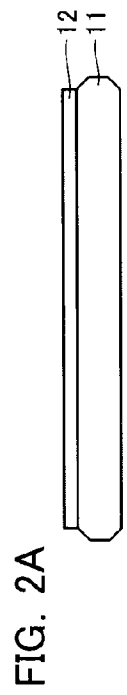
FIG. 2 shows manufacturing processes of the semiconductor device according to the present embodiment.

First, as shown in FIG. 2A, the element forming layer 12 configured from silicon is formed on the silicon wafer 11 by epitaxial growth or the like. Then, a semiconductor memory is formed on this element forming layer 12 by a well-known method. The semiconductor memory is, for example, NAND cell type flash memory, dynamic random access memory (DRAM), static random access memory (SRAM), magnetoresistive memory, resistance varying memory, and so on. That is, types of the semiconductor memory are not limited to specific ones. A plurality of memory chips (for example, about 500) are formed on one silicon wafer 11.

Figure 2B:
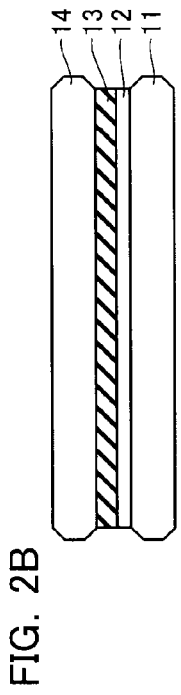

Then, as shown in FIG. 2B, after the adhesive agent 13 is coated on an upper surface of the element forming layer 12, a support substrate 14 and the element forming layer 12 are adhered by this adhesive agent 13. Employable as the adhesive agent 13 is, for example, an acrylic resin, or the like. Moreover, the support substrate 14 may be formed by, for example, glass.

Figure 2C:
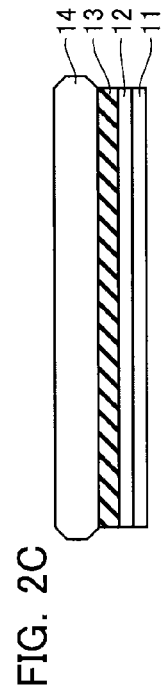
Figure 2D:
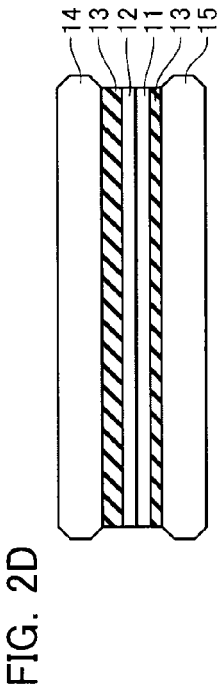
Figure 2E:
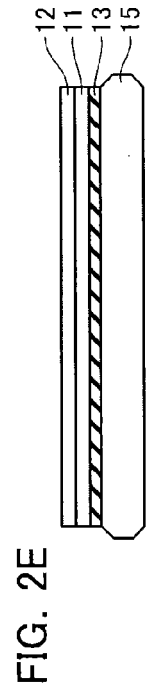

Next, as shown in FIG. 2C, chemical mechanical polishing (CMP) or the like is employed to reduce a film thickness of the silicon wafer 11, and then, as shown in FIG. 2D, a substrate 15 is attached to an underside of the silicon wafer 11 via the adhesive agent 13. Then, as shown in FIG. 2E, the support substrate 14 is stripped.

Figure 2F:
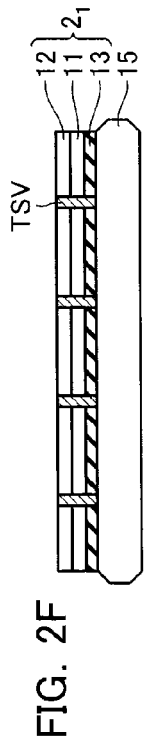

Then, as shown in FIG. 2F, penetrating electrodes TSV are formed in each of the memory chips so as to penetrate the element forming layer 12 and the silicon wafer 11. As an example, the penetrating electrodes TSV are formed by the following kind of process. First, photolithography and dry etching are executed to form contact vias in the element forming layer 12 and the silicon wafer 11. Then, a CVD method or the like is employed to fill those contact vias with a metal film (tungsten or the like). Then, CMP is executed to remove any of the metal film formed outside the contact vias, whereby the penetrating electrodes as in FIG. 2F are formed.

Figure 2G:
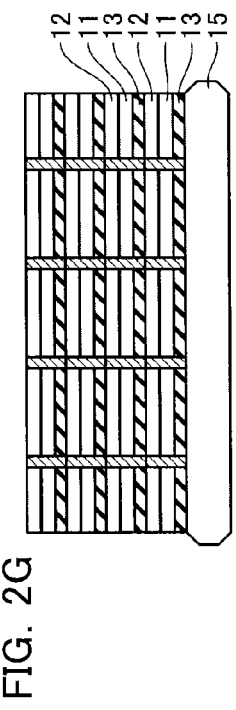

Hereafter, as shown in FIG. 2G, by repeating similar processes to those shown in FIGS. 2A-2F multiple times and adhering by the adhesive agent 13, a plurality of silicon wafers 11 are stacked and attain a state of being electrically connected to one another by the penetrating electrodes TSV. As a result, the semiconductor memory chips aligned in the stacking direction formed on a plurality of the silicon wafers 11 attain a state of being electrically connected to one another.

Figure 2H:
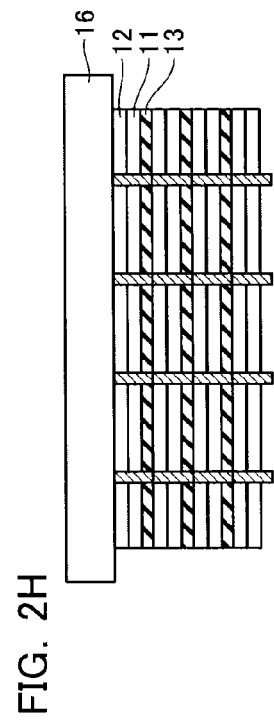
Figure 2I:
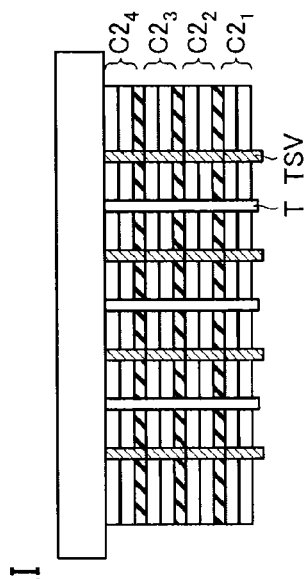

Then, as shown in FIG. 2H, a dicing tape 16 is attached to an upper surface of the element forming layer 12 formed on an uppermost layer of the silicon wafers 11. Then, as shown in FIG. 2I, dicing is performed along dicing lines T formed between the memory chips to cut the stacked wafers into memory chip units. This allows the first chip stack 20 as shown in FIG. 1 to be formed. The second chip stack 30 may also be formed by a similar procedure.

As the description of FIG. 2 also makes clear, the W2W method enables several semiconductor chips formed on each of a plurality of silicon wafers to be stacked in wafer units before dicing, and then electrically connected by penetrating electrodes. Therefore, compared to the C2C method where dicing is first performed and then the semiconductor chips are stacked on a chip-by-chip basis, manufacturing processes can be simplified.

However, the W2W method has a problem that since defective semiconductor chips are included in the stacked wafers in a certain proportion, yield deteriorates compared to the C2C method. Yield falls cumulatively as the number of stacked wafers increases. If yield falls greatly, final manufacturing costs become increased compared to those of the C2C method.

FIG. 3A-3C include tables showing the relationship between yield in one wafer (ratio of defective semiconductor chips among the semiconductor chips included in one wafer), number of stacked wafers (number stacked), and yield in the first chip stack 20 or the second chip stack 30.

FIG. 3A shows the relationship between yield in one wafer, number of wafers stacked, and probability that all of the semiconductor chips in the first chip stack 20 or the second chip stack 30 are non-defective (all-chip non-defect rate). FIG. 3B shows the relationship between yield in one wafer, number of wafers stacked, and probability that only one of the semiconductor chips in the first chip stack 20 or the second chip stack 30 is defective (one-chip defect rate). FIG. 3C shows the relationship between yield in one wafer, number of wafers stacked, and probability that two of the semiconductor chips in the first chip stack 20 or the second chip stack 30 are defective (two-chip defect rate).

As an example, the case that yield in one wafer is 95% is considered. In this case, all-chip non-defect rate of the first chip stack 20 or the second chip stack 30 lowers as the number of stacked wafers increases. For example, when the number of stacked wafers is five, the all-chip non-defect rate of the first chip stack 20 or the second chip stack 30 is 77% ($=0.95^5 \times 100$). If the number of stacked wafers increases even more, the non-defect rate lowers even more.

Moreover, as shown in FIG. 3B, when yield in one wafer is 95%, one-chip defect rate increases as the number of stacked wafers increases. For example, when the number of stacked wafers is five, the one-chip defect rate of the first chip stack 20 or the second chip stack 30 is 20% ($=0.95^4 \times 0.05 \times 5$).

Similarly, as shown in FIG. 3C, when yield in one wafer is 95%, two-chip defect rate increases as the number of stacked wafers increases. For example, when the number of stacked wafers is five, the two-chip defect rate of the first chip stack 20 or the second chip stack 30 is 2%.

As the above description makes clear, when the W2W method is employed, as the number of stacked wafers increases, a semiconductor device with large memory capacity can be formed with a smaller number of process steps. On the other hand, the non-defect rate of the first chip stack 20 or the second chip stack 30 lowers. Therefore, there is a trade-off relationship between simplification of the manufacturing method and improvement of non-defect rate.

Figure 4:
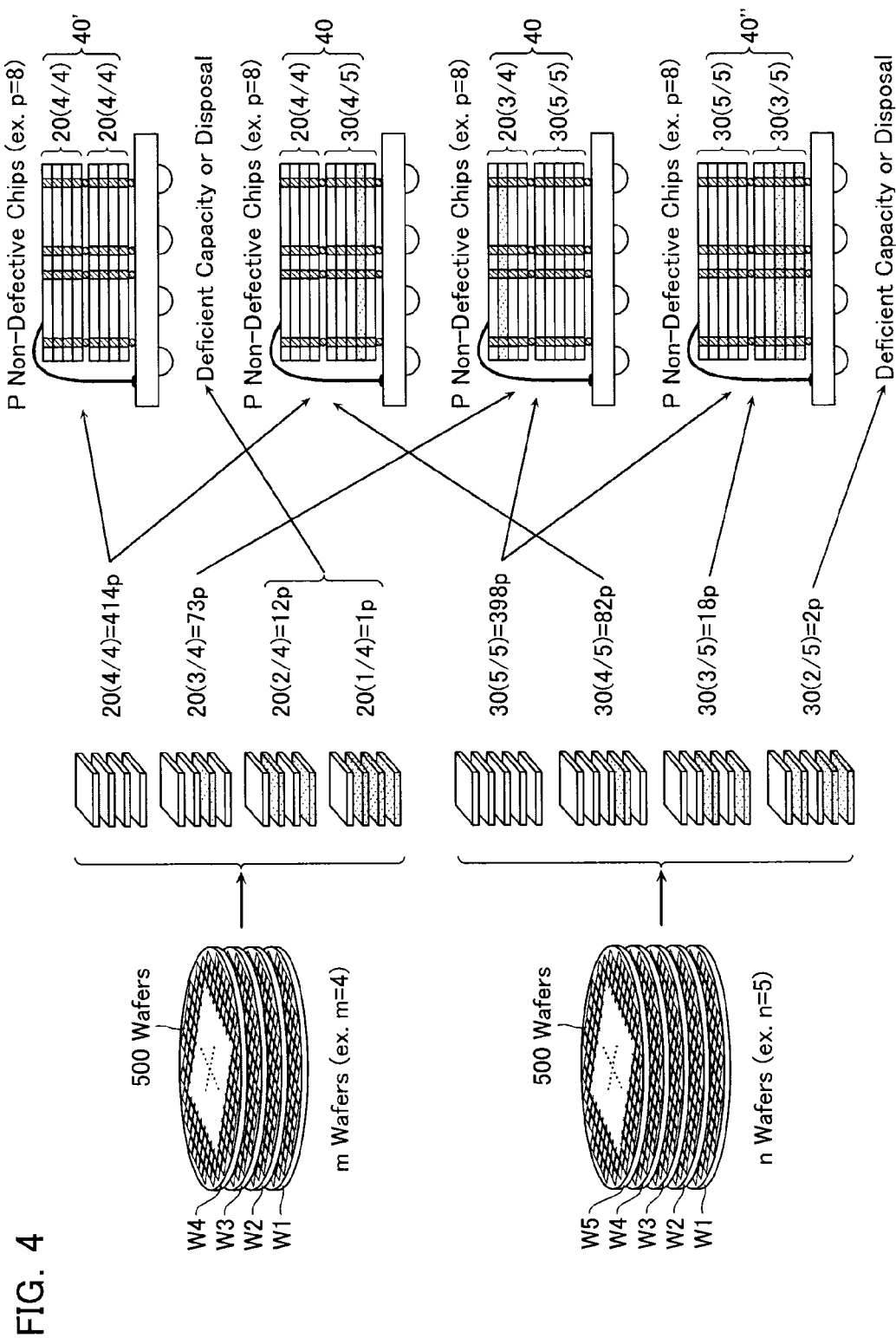
FIG. 4 shows manufacturing processes of a semiconductor device according to an embodiment.

Accordingly, the present embodiment aims to achieve both simplification of the manufacturing method and improvement of non-defect rate by adopting manufacturing processes such as shown in FIG. 4. In the present embodiment, in the case of finally forming a chip stack including a desired number of (for example, p) non-defective semiconductor chips, rather than stacking p wafers at a time, first, m wafers (m<p) are stacked to form the first chip stack 20 including m semiconductor chips, and, in addition, n wafers (n<p, p≤m+n) are stacked to form the second chip stack 30 including n semiconductor chips. Then, after identifying the number of defective semiconductor chips in these first chip stacks 20 (m chips) and second chip stacks 30 (n chips) by a test with a tester, the first chip stacks 20 and the second chip stacks 30 are sorted according to the number of defective semiconductor chips included in the stacks.

Then, the first chip stack 20 and the second chip stack 30 are combined such that the number of non-defective semiconductor chips in the third chip stack 40 configured from the first chip stack 20 and the second chip stack 30 is p. In FIG. 4, description proceeds taking as an example the case where m=4, n=5, and p=8. However, the present embodiment is not limited to these numbers.

Considered herein is the case where m=4, n=5, and p=8, and 500 semiconductor chips C are formed in one wafer W. In this case, of the 500 first chip stacks (four stacked chips), about 414 are all-chip non-defect first chip stacks 20 (20(4/4)). Moreover, about 73 are one-chip defect first chip stacks 20 (20(3/4)), about 12 are two-chip defect first chip stacks 20 (20(2/4)), and about 1 is a three-or-more-chip defect first chip stack 20 (20(1/4)).

In addition, of the 500 second chip stacks 30 (four stacked chips), about 398 are all-chip non-defect second chip stacks 30 (30(5/5)). Moreover, about 82 are one-chip defect second chip stacks 30 (30(4/5)), about 18 are two-chip defect second chip stacks 30 (30(3/5)), and about 2 are three-or-more-chip defect first chip stacks 30 (30(2/5)).

In this case, combining first chip stacks 20(4/4) enables a chip stack 40' including eight non-defective chips (zero defective chips) to be generated. This chip stack 40' differs from the third chip stack 40 in FIG. 1 and is similar to a conventional chip stack in not including even a single defective memory chip.

Moreover, combining the first chip stack 20(4/4) and the second chip stack 30 (4/5) enables the third chip stack 40 similar to that in FIG. 1 including eight non-defective chips (one defective chip) to be generated.

Alternatively, combining the first chip stack 20(3/4) and the second chip stack 30(5/5) enables the third chip stack 40 similar to that in FIG. 1 including eight non-defective chips (one defective chip) to be generated.

In addition, combining the second chip stack 30 (5/5) and the second chip stack 30(3/5) enables a chip stack 40'' including eight non-defective chips (two defective chips) to be generated. This chip stack 40'' also includes p=8 non-defective chips, similarly to the third chip stack 40.

Note that first chip stacks 20(2/4) and 20(1/4) including two or more defective chips or second chip stacks 30(2/5) including three or more defective chips may be disposed of, or manufactured and sold as low-cost products of deficient capacity.

As described above, in the present embodiment, when manufacturing a semiconductor device 100 including p non-defective memory chips, the first chip stacks 20 including m memory chips and the second chip stacks 30 including n memory chips are generated, and these stacks are combined to manufacture the semiconductor device including p non-defective memory chips. As shown in FIG. 1, such a semiconductor device may be a semiconductor device configured by a chip stack not including even a single defective memory chip. However, such a semiconductor device may also include a semiconductor device configured by the third chip stack 40 including one or more defective memory chips. To the extent that the latter is allowed, a high yield can be achieved. Specifically, when eight wafers at a time are stacked by the W2W method, yield is 65%, but, as in the above-described example, when the first chip stacks 20 formed by stacking four wafers by the W2W method and the second chip stacks 30 formed by stacking five wafers by the W2W method are combined to allow one defective chip, yield can be raised to a maximum of close to 97% (case where manufactured number of first chip stacks 20 and manufactured number of second chip stacks 30 are in the ratio of 4:1).

Figure 5:
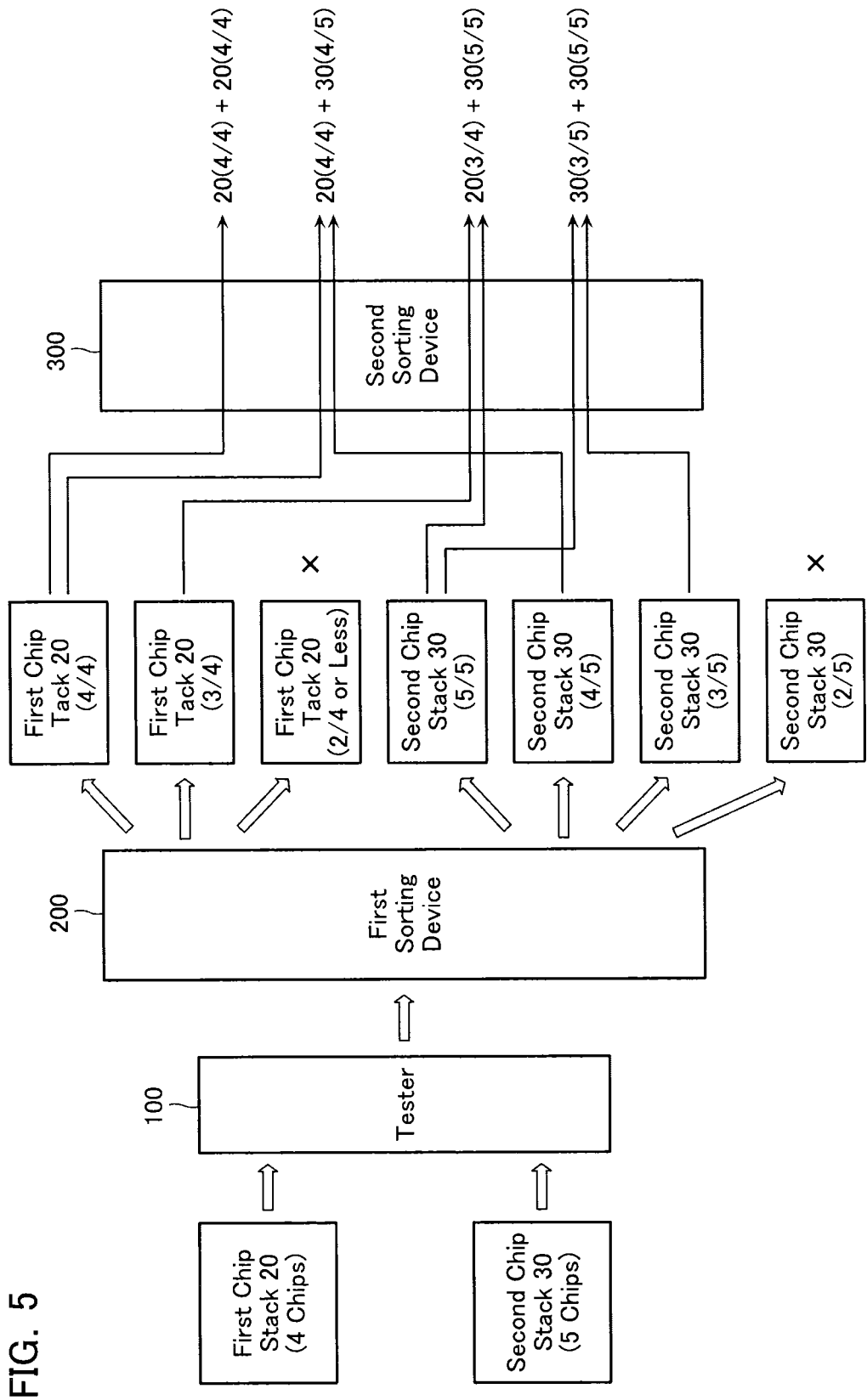
FIG. 5 shows a management system of the semiconductor device according to the present embodiment.

FIG. 5 is a block diagram showing a configuration of a system for manufacturing a semiconductor device according to the present embodiment. This system comprises a tester 100, a first sorting device 200, and a second sorting device 300.

The tester 100 may be similar to a well-known tester, and identifies a position and number of defective memory chips included in the first chip stack 20 and the second chip stack 30. The first sorting device 200 sorts the first chip stacks 20 and the second chip stacks 30 based on numbers of defective memory chips obtained by the tester 100. The second sorting device 300 combines the first chip stacks 20 and the second chip stacks 30 appropriately according to a principle as in FIG. 4 to generate the semiconductor device 100.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
after stacking m wafers (where m is a number of two or more) in each of which a plurality of semiconductor chips are formed, dicing the m wafers to semiconductor chips to form first chip stacks each having m of the semiconductor chips stacked;
after stacking n of the wafers (where n is a number of two or more), performing dicing of the n wafers on the basis of the semiconductor chips to form second chip stacks each having n of the semiconductor chips stacked;
sorting the first chip stacks according to the number of defective semiconductor chips included in each of the first chip stacks;
sorting the second chip stacks according to the number of defective semiconductor chips included in each of the second chip stacks; and
combining the first chip stacks and/or the second chip stacks after sorting to form a third chip stack according to the number of total number of defective semiconductor chips included in first chip stacks or second chip stacks that are to be combined,
wherein the third chip stack is combined by selecting semiconductor chips from the first chip stacks and/or the second chip stacks such that a number of non-defective semiconductor chips included in the third chip stack is p, p being an integer that meets m<p and n<p.

2. The method of manufacturing a semiconductor device according to claim 1, wherein
n is a number larger than m by an amount of 1 (n=m+1).

3. The method of manufacturing a semiconductor device according to claim 1, further comprising:
before the dicing, forming a penetrating electrode that penetrates the wafers.

4. The method of manufacturing a semiconductor device according to claim 1, wherein
either one of the first chip stack and the second chip stack includes one defective semiconductor chip, and the semiconductor chips included in the other of the first chip stack and the second chip stack are all non-defective semiconductor chips.

5. The method of manufacturing a semiconductor device according to claim 4, wherein n is a number larger than m by an amount of 1 (n=m+1).

6. The method of manufacturing a semiconductor device according to claim 1, wherein the m wafers are joined to one another before the dicing.

7. The method of manufacturing a semiconductor device according to claim 6, wherein the first chip stack and the second chip stack are formed without disconnecting m of the wafers or n of the wafers.

8. The method of manufacturing a semiconductor device according to claim 1, wherein the first chip stack or the second chip stack may include a defective semiconductor chip.

* * * * *